United States Patent
Cui et al.

(10) Patent No.: US 10,886,503 B2
(45) Date of Patent: *Jan. 5, 2021

(54) MICROLENS ARRAY ARCHITECTURES FOR ENHANCED LIGHT OUTCOUPLING FROM AN OLED ARRAY

(71) Applicants: Universal Display Corporation, Ewing, NJ (US); Kent State University, Kent, OH (US)

(72) Inventors: Yue Cui, Kent, OH (US); Deng-ke Yang, Hudson, OH (US); Ruiqing Ma, Morristown, NJ (US); Gregory McGraw, Yardley, PA (US); Julia J. Brown, Yardley, PA (US)

(73) Assignees: Universal Display Corporation, Ewing, NJ (US); Kent State University, Kent, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/654,042

(22) Filed: Oct. 16, 2019

(65) Prior Publication Data

US 2020/0119312 A1     Apr. 16, 2020

Related U.S. Application Data

(63) Continuation of application No. 14/284,461, filed on May 22, 2014, now Pat. No. 10,468,633.
(Continued)

(51) Int. Cl.
*H01L 51/52*     (2006.01)
*G02B 3/00*      (2006.01)

(52) U.S. Cl.
CPC ........ *H01L 51/5275* (2013.01); *G02B 3/0043* (2013.01); *G02B 3/0056* (2013.01)

(58) Field of Classification Search
CPC .. H01L 51/5275; G02B 3/0043; G02B 3/0056
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |

(Continued)

FOREIGN PATENT DOCUMENTS

| | | |
|---|---|---|
| CN | 1495499 A | 5/2004 |
| CN | 1624495 A | 6/2005 |

(Continued)

OTHER PUBLICATIONS

Baldo et al. Highly efficient phosphorescent emission from organic electroluminescent devices, Nature, vol. 395, pp. 151-154, 1998.

(Continued)

*Primary Examiner* — Dung A. Le
(74) *Attorney, Agent, or Firm* — Butzel Long

(57) ABSTRACT

Novel microlens array architectures for enhanced light outcoupling from light emission are provided. Organic light emitting devices (OLEDs) that include an outcoupling layer including these novel microlens array architectures and method for fabricating such OLEDs are provided. These devices may be used to provide OLEDs with optimized light extraction.

16 Claims, 11 Drawing Sheets

Related U.S. Application Data

(60) Provisional application No. 61/831,359, filed on Jun. 5, 2013.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,072,620 A | 6/2000 | Shiono |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,829,087 B2 | 12/2004 | Freese |
| 7,279,704 B2 | 10/2007 | Walters |
| 7,431,968 B1 | 10/2008 | Shtein |
| 7,968,146 B2 | 6/2011 | Wagner |
| 8,257,793 B2 | 9/2012 | Forrest |
| 8,896,925 B2 | 11/2014 | Kim |
| 10,468,633 B2 * | 11/2019 | Cui ..................... G02B 3/0043 |
| 2003/0122480 A1 | 7/2003 | Wei |
| 2003/0230980 A1 | 12/2003 | Forrest |
| 2004/0174116 A1 | 9/2004 | Lu |
| 2005/0057176 A1 | 3/2005 | Lu |
| 2006/0007552 A1 | 1/2006 | Takakuwa |
| 2008/0238310 A1 | 10/2008 | Forrest |
| 2010/0033829 A1 | 2/2010 | Wippermann |
| 2010/0181899 A1 | 7/2010 | Forrest |
| 2011/0025940 A1 | 2/2011 | Liu |
| 2011/0116014 A1 | 5/2011 | Lee |
| 2011/0259407 A1 | 10/2011 | Kim |
| 2012/0154713 A1* | 6/2012 | Kwon ............... G02F 1/133621 349/64 |
| 2017/0229663 A1 | 8/2017 | Tsai |

FOREIGN PATENT DOCUMENTS

| | | |
|---|---|---|
| CN | 1719955 A | 1/2006 |
| CN | 101647134 A | 2/2010 |
| CN | 102237429 A | 11/2011 |
| KR | 20090128437 A | 12/2009 |
| KR | 20120105369 A | 9/2012 |
| WO | 2008057394 A1 | 5/2008 |
| WO | 2009009695 A1 | 1/2009 |
| WO | 2010011390 A2 | 1/2010 |
| WO | 2012124983 A2 | 9/2012 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Becker, E.W. et al.Fabrication of microstructures with high aspect ratios and great structural heights by synchrotron radiation lithography, galvanoforming, and plastic moulding (LIGA process), Microelectronic Engineering 4 (1986) 35-56, North Holland.

Becker, Holger et al.,"Hot embossing as a method for the fabrication of polymer high aspect ratio structures", Sensors and Actuators 83 (2000), pp. 130-135.

Kuo, Shu-Ming et al.,"Fabrication of aspherical SU-8 microlens array utilizing novel stamping process and electrostatic pulling method", 2010 Optical Society of America—vol. 18, No. 18/Optics Express, Aug. 25, 2010.

Liu, K.H. et al.Fabrication of an aspherical microlens for OLED with modified etching process, 2010 International Conference on Electrical and Control Engineering.

Moeller, S. et al.Improved light emitting diodes employing ordered microlens arrays, Journal of Applied Physics 91, 3324 (2002), doi: 1063/1.1435422.

Morford, Robert et al.Press-patterned UV-curable high refractive index coatings, Proceedings of SPIE, vol. 6123 Society of Photo-Optical Instrumentation Engineers, 2006, pp. 612301-1-612301-11.

Office Action dated Oct. 9, 2016 as received in CN Application No. 201410247435.6.

Korean Office Action (with English language translation) for Application No. KR10-2014-0067500, dated Dec. 17, 2019, 14 pages.

* cited by examiner

MICROLENS ARRAY ARCHITECTURES FOR ENHANCED LIGHT OUTCOUPLING FROM AN OLED ARRAY

PRIORITY

This application claims priority to U.S. Provisional Application No. 61/831,359, filed Jun. 5, 2013, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, Kent State University, and the Universal Display Corporation. The agreement was in effect on and before the date the claimed invention was made, and the claimed invention was made as a result of activities undertaken within the scope of the agreement.

FIELD OF THE INVENTION

The present invention relates to devices involving light emission and light absorption such as light-emitting diodes (LEDs), organic light-emitting devices (OLEDs), and photovoltaic devices (PVs). More specifically, it relates to microlens array architectures for enhanced light outcoupling from light emission.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

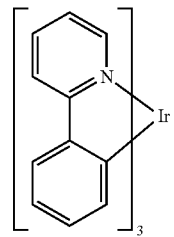

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Extraction of light from the substrate of a light emitting device is a major challenge in solid state lighting. When light crosses from a material with index of refraction no to a material with index $n_1$, such that $n_0 > n_1$, a portion of the incident light rays remain in the higher index material due to total internal reflection. Glass and plastic have significantly higher refractive indices than air and light emitting structures have indices that are higher still. The potential for light loss therefore exists at two interfaces in an OLED structure. In general, only about 25% of light generated in the emissive layer of an OLED is outcoupled to the surrounding environment. Typically, light is lost to total internal reflection at both the interface between the device and its substrate and the substrate to air interface.

Microlens arrays can be applied to the light emitting side of OLED substrates to reduce the light lost due to total internal reflection at the substrate to air interface. (Moller et al., Improved Light Out-coupling in Organic Light Emitting Diodes Employing Ordered Microlens Arrays, J. Appl. Phys. 91, 3324 (2002)). Microlens arrays are well known outcoupling aids for OLED lighting. Existing examples of microlens arrays feature arrays of microlenses of uniform size with a spherical thickness profile. Microlens arrays are currently mass produced as outcoupling aids for devices such as LCD displays and are generally fabricated from plastic with a relatively low index of refraction, such as n~1.5. Most lenses have faces with constant curvature for ease of manufacturing although aspheric lenses are used in high end imaging optics to reduce spherical aberration. Microlenses are generally spherical and the shape of molded or embossed microlenses is determined by the shape of the mold used to form them. Aspherical microlenses can be readily formed from molds with aspherical features, however these molds can be more difficult to fabricate than spherical ones. Aspherical microlenses have been demonstrated as optical outcoupling aids for OLED films by Liu et al., Fabrication of an Aspherical Microlens for OLED with Modified Etching Process; International Conference on Electrical and Control Engineering 2010.

SUMMARY OF THE INVENTION

In one aspect, a device that includes an organic light emitting device comprising an organic emissive layer is provided. An outcoupling layer is optically coupled to the emissive layer, and includes a plurality of microlenses. In an aspect, for each microlens of the plurality of microlenses, each point on a surface of the microlens has a tangent plane that forms an interior angle of not more than 90 degrees with an interface of the outcoupling layer and the organic light emitting device. In an aspect, each microlens of the plurality of microlenses has a lens height H and a largest base measurement 2R, and H/R is greater than 1. In an aspect, H/R is greater than 1.5. In another aspect, H/R is at least 2.

In an aspect, the base measurement R is a radius, and each microlens is radially symmetric about an axis of the microlens that is normal to the interface of the outcoupling layer with the organic light emitting device. In another aspect, each microlens has a rectangular base. In an aspect, each microlens has an elliptical base.

In an aspect, each microlens of the plurality of microlenses has a thickness profile defined by a continuous function in r, where r is the distance from an axis of the microlens centered on the base of the microlens and normal to the interface of the outcoupling layer with the organic light emitting device. In an aspect, r is less than or equal to R. In one aspect, the function is a quadratic polynomial of r. In another aspect, the function is a cubic polynomial of r.

In an aspect, the outcoupling layer has a periodically varying thickness across a plane parallel to the interface of the outcoupling layer with the organic light emitting device. In one aspect, the plurality of microlenses are closely packed.

In one aspect, the plurality of microlenses comprise a first material having an index of refraction X, and a layer of the organic light emitting device adjacent to the outcoupling layer comprises a second material having an index of refraction Y, and the difference between X and Y is less than 0.1. In an aspect, a layer of the organic light emitting device adjacent to the outcoupling layer comprises a material having an index of refraction of at least 1.7. In another aspect, the outcoupling layer comprises a single material. In an aspect, the plurality of microlenses comprise a first material and a portion of the outcoupling layer adjacent to the organic light emitting device comprises a second material. In one aspect, the plurality of microlenses comprise a material having an index of refraction greater than 1.5. In another aspect, the plurality of microlenses comprise a material having an index of refraction greater than 1.7.

In an aspect, the device has a fill factor defined by the fraction of a surface of the light emitting device covered by the plurality of microlenses, and wherein the fill factor is at least about 90%.

In an aspect, at least one microlens of the plurality of microlenses has a base measurement $2R_1$ and at least one microlens of the plurality of microlenses has a base measurement $2R_2$, and wherein $R_1$ is different from $R_2$. In another aspect, at least one microlens of the plurality of microlenses has a radius $R_1$ and at least one microlens of the plurality of microlenses has a radius $R_2$, and wherein $R_1$ is different from $R_2$. In one aspect, the plurality of microlenses are arranged in a repeating pattern.

In an aspect, the outcoupling layer comprises a transparent polymer substrate. In one aspect, the transparent polymer substrate is flexible.

In an aspect, the plurality of microlenses are embossed into the outcoupling layer. In one aspect, the plurality of microlenses are formed by a subtractive process. In another aspect, the plurality of microlenses are formed by an additive process.

In an aspect, a method of fabricating an emissive device includes fabricating an outcoupling layer that includes a plurality of microlenses on a first surface of substrate. In one aspect, for each microlens of the plurality of microlenses, each point on a surface of the microlens has a tangent plane that forms an interior angle of not more than 90 degrees with an interface of the outcoupling layer and the substrate. In an aspect, each microlens of the plurality of microlenses has a lens height H and a largest base measurement R, and H/R is greater than 1.

In an aspect, the method may further include obtaining an organic light emitting device, and disposing the organic light emitting device on a second surface of the substrate opposite the first surface.

In an aspect, the plurality of microlenses are embossed into the light emissive layer. In one aspect, the plurality of microlenses are formed by a subtractive process. In another aspect, the plurality of microlenses are formed by an additive process.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
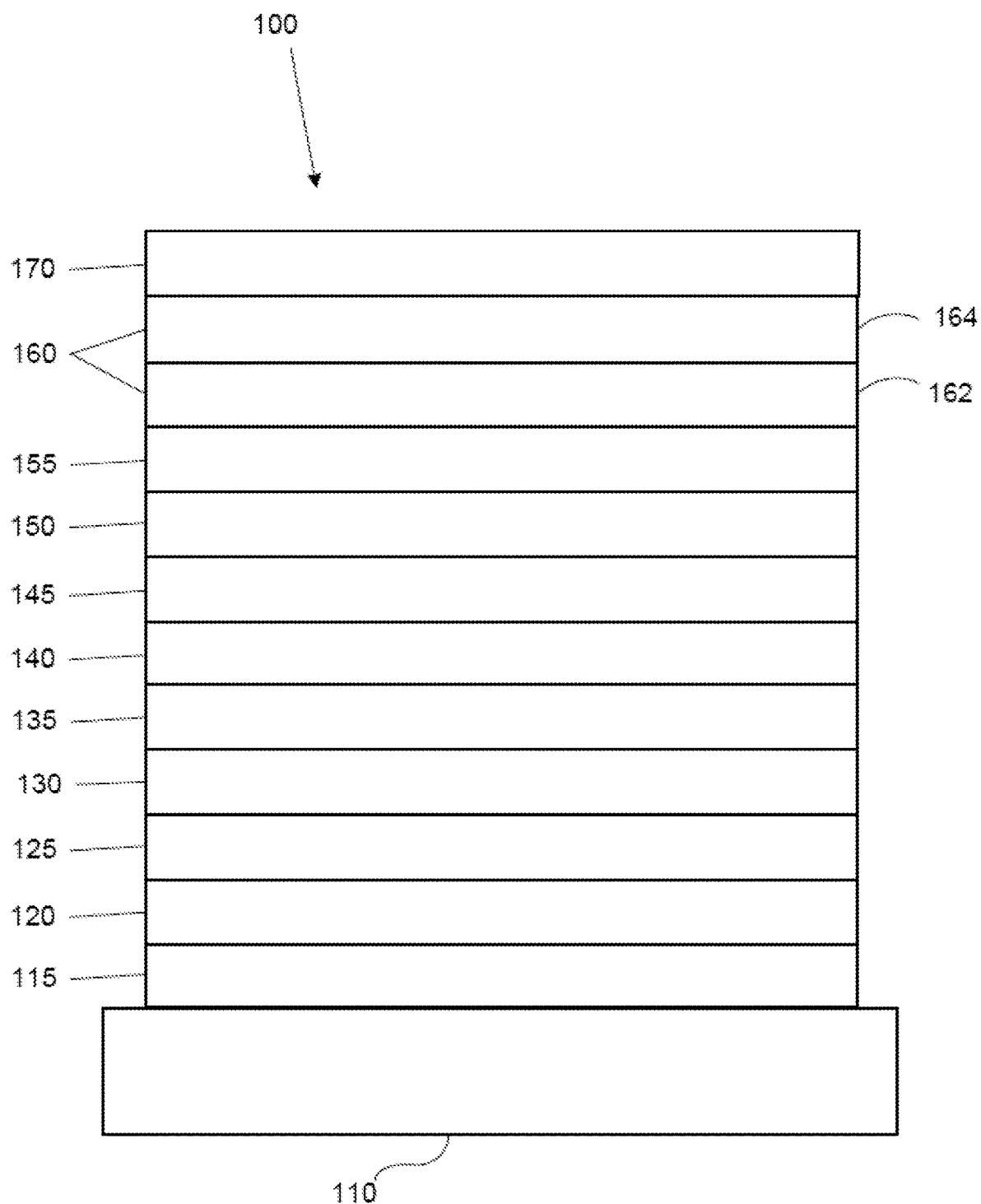
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
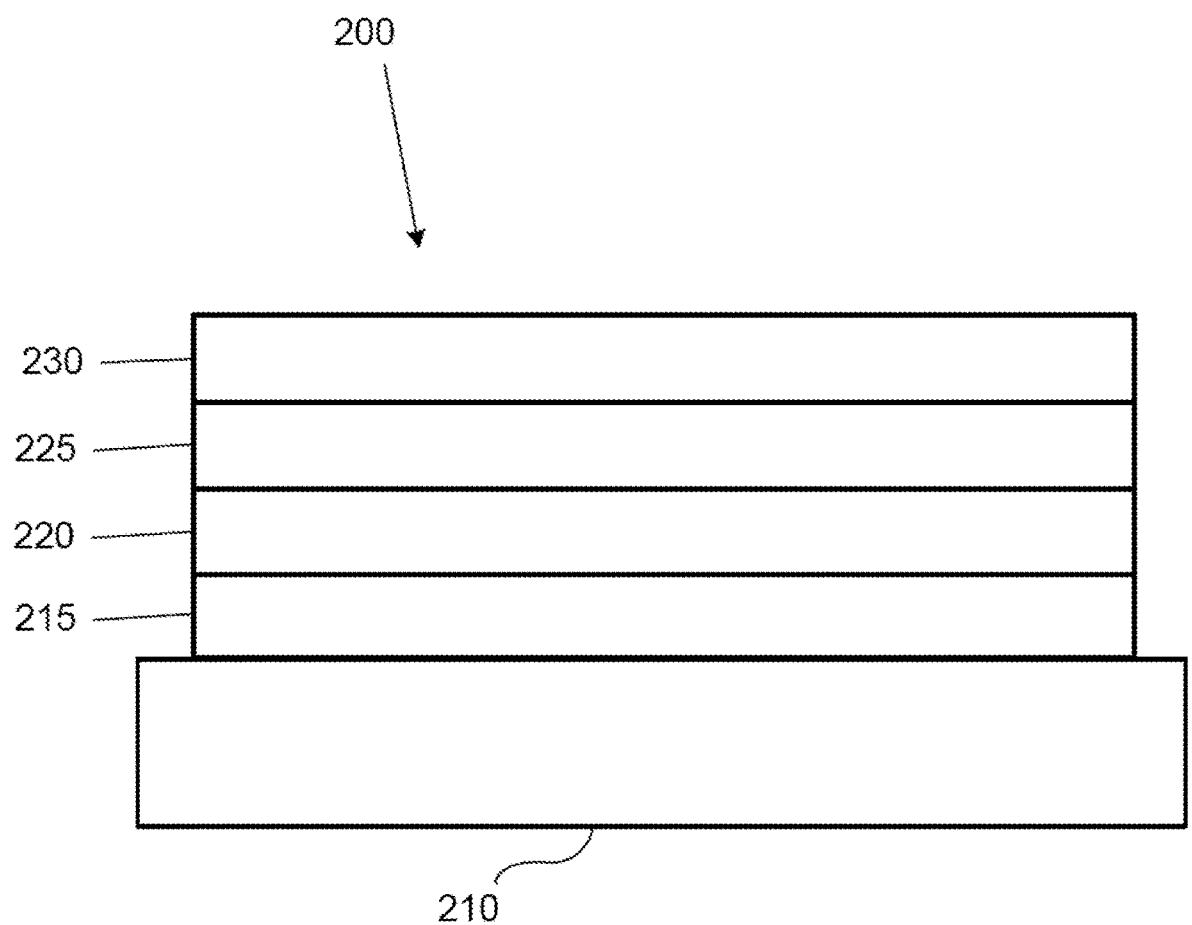
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Microlens arrays are well known outcoupling aids for OLED lighting. Existing examples of microlens arrays feature arrays of microlenses of uniform size with a spherical thickness profile. According to the presently disclosed subject matter, improved outcoupling performance can be achieved by using tall, high aspect ratio microlenses with an aspheric profile. The present disclosure demonstrates that high aspect ratio aspheric microlenses provide more efficient outcoupling. According to the present disclosure, outcoupling enhancement can also be improved using an array of microlenses of different sizes in a repeating pattern such that smaller microlenses fill gaps between larger ones. Current microlens arrays only feature microlenses of one size. According to the presently disclosed subject matter, a repeating array of microlenses of different sizes increases the area of substrate that is covered by microlenses, which also improves outcoupling.

In addition, the present disclosure demonstrates that optical outcoupling can be improved by fabricating both the microlens array and OLED substrate from high refractive index (e.g., n~1.7) plastic. Loss of light due to total internal reflection at the interface between the light emitting device and substrate can be controlled by using a substrate that closely matches the index of refraction of the active layers of the device. OLED materials and indium tin oxide have relatively high indices of refraction (n~1.8) compared to conventional substrate materials. Some transparent plastics, such as biaxially stretched polyethylene napthalate, have a comparable index of refraction. OLEDs can be fabricated on substrates with sufficiently high index to eliminate loss at the device to the substrate interface. Refractive index match between the OLED and the substrate can result in less loss of light within the OLED. The presence of microlenses at the substrate-air interface helps to mitigate losses due to the large refractive index mismatch and promote efficient outcoupling.

Using a high index substrate for OLED growth reduces the loss of light at the OLED to substrate interface. However, this increases the loss of light at the substrate to air interface, leading to a net loss of power. According to the present disclosure, forming a microlens array onto the air side of a high index substrate mitigates this loss and results in a net increase in light outcoupling when compared to a lower index substrate with a similar microlens array. Fabricating microlenses from an index matched material added to a planar substrate may yield a device that provides similar performance.

Aspherical microlenses with a high aspect ratio H/R can be fabricated using the methods such as the one outlined by Kuo et al., Fabrication of Aspherical SU-8 Microlens Array Utilizing Novel Stamping Process and Electrostatic Pulling Method, Optical Society of America 2010. An ordered array of hemispherical droplets of UV curable polymer is stamped onto a substrate. The stamp adds lens material to the substrate; as such, the lenses and substrate do not necessarily have the same composition. The polymer droplets are then stretched in a direction normal to the substrate using an electric field and take on an approximately parabolic shape. This shape is then made permanent by UV curing the droplets. Another technique for making such a structure is to emboss microlens forms directly onto the front surface of a high index polymer sheet and then use the back surface of the sheet as an OLED growth substrate.

The presently disclosed outcoupling layer(s), microlens structure(s), and methods of fabricating the same, can be used with OLED lightings and displays as well as other types of light emitting devices requiring a planar substrate. This microlens architecture can also be used for waveguide outcoupling surfaces, and can also be used for optical enhancement of backlight outcoupling such as those in LCD displays.

Figure 3A:
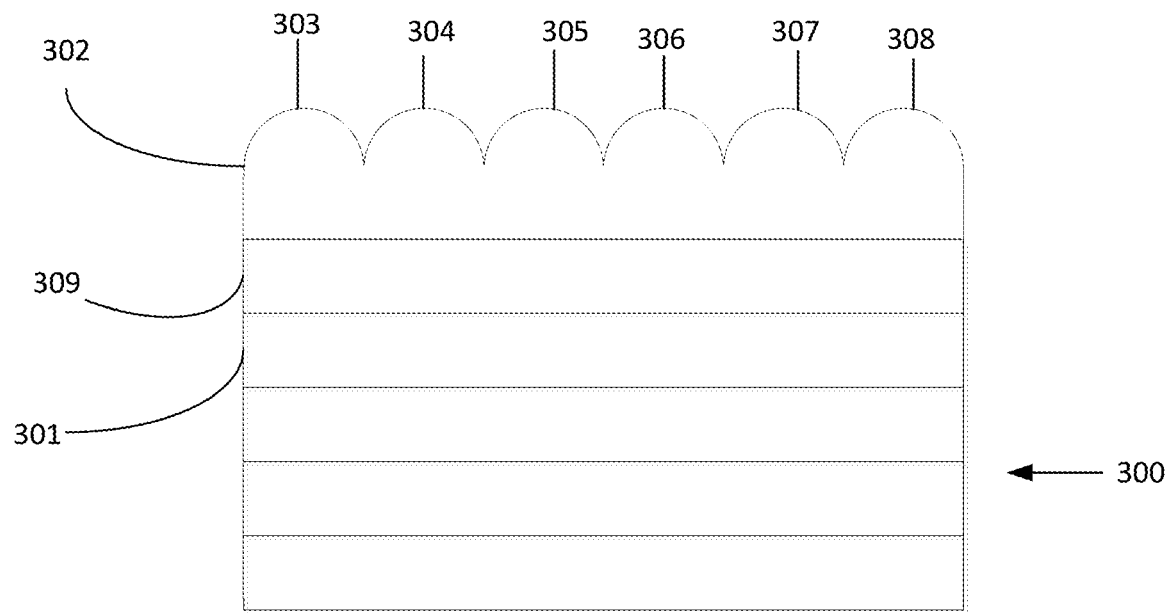
FIGS. 3(A) and (B) show an example device and microlens.

FIG. 3A shows an example device according to an embodiment of the present disclosure. According to an embodiment of the present disclosure, a device includes an organic light emitting device 300 including an organic emissive layer 301, an outcoupling layer 302, and an electrode 309 such as a transparent electrode. The outcoupling layer 302 is optically coupled to the emissive layer 301. The outcoupling layer 302 includes multiple microlenses 303, 304, 305, 306, 307, and 308. In an embodiment, the outcoupling layer 302 has a periodically varying thickness across a plane parallel to the interface of the outcoupling layer 302 with the organic light emitting device 300, such as the thickness caused by periodic microlenses 303-308.

Figure 3B:
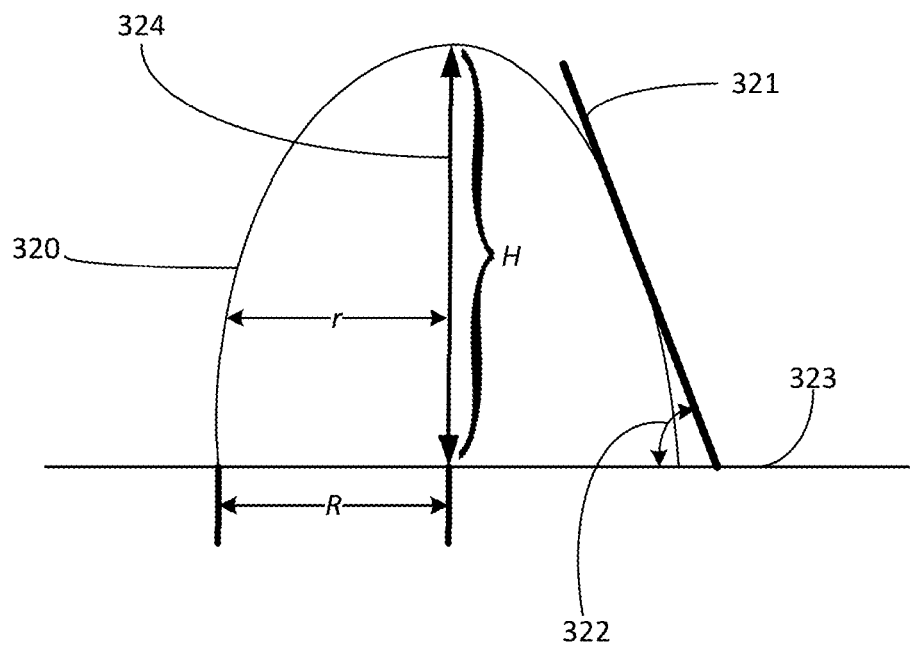

As shown in FIG. 3B, for a microlens 320, each point on a surface of the microlens has a tangent plane, such as 321, that forms an interior angle 322 of not more than 90 degrees with an interface 323 of the outcoupling layer and the organic light emitting device. In an embodiment, each point on a surface of the microlens may have a tangent plane, such as 321, that forms an interior angle 322 of less than 90 degrees with an interface 323 of the outcoupling layer and the organic light emitting device. As shown in FIG. 3B, a microlens 320 has a lens height H and a largest base measurement 2R. The largest base measurement 2R of a microlens is the diameter of the microlens. In some embodiments, H/R may be greater than 1, H/R may be greater than 1.5, and H/R may be at least 2. Ray tracing simulations demonstrate that significantly more efficient outcoupling can be obtained for parabolic and cubic microlenses than spherical microlenses. Spherical microlenses exhibit optimal outcoupling when H/R=1. For H/R<1 outcoupling from parabolic or cubic microlens arrays is inferior to spherical microlenses. However, for H/R>1, improved outcoupling can be obtained for parabolic and cubic arrays than that obtained for spherical arrays at H/R=1.

The base of a microlens may be of any shape such as circular, rectangular, square, triangular, elliptical, octagonal, hexagonal, etc. FIG. 3B shows an example microlens according to an embodiment of the present disclosure. As shown in FIG. 3B, the base of a microlens may be circular, in which case, the base measurement R is a radius. For example, each microlens is radially symmetric about an axis 324 of the microlens that is normal to the interface 323 of the outcoupling layer with the organic light emitting device.

An example of a microlens according to the disclosed subject matter is a radially symmetric microlens, as shown in FIG. 3B. Each microlens has a thickness profile defined by a continuous function in r, wherein r is the distance from an axis 324 of the microlens 320 centered on the base of the microlens 320 and normal to the interface 323 of the outcoupling layer with the organic light emitting device. As shown, r is less than or equal to R. The thickness profile of the microlenses can be given by either equation 10.1, 10.2 or 10.3, and more generally 10.4, shown below, where $r^2=(x-x_c)^2+(y-y_c)^2$. Equation 10.1 yields microlenses with a parabolic shape, equation 10.2 is a quadratic polynomial and describes microlenses with constant curvature, which are referred to as spherical. Microlenses obeying equation 10.3 are referred to as cubic.

$$\frac{1}{R^2}(x-x_c)^2 + \frac{1}{R^2}(y-y_c)^2 + \frac{z}{H} - 1 = 0 \qquad 10.1$$

$$\frac{1}{R^2}(x-x_c)^2 + \frac{1}{R^2}(y-y_c)^2 + \frac{z^2}{H^2} - 1 = 0 \qquad 10.2$$

$$\frac{1}{R^2}(x-x_c)^2 + \frac{1}{R^2}(y-y_c)^2 + \frac{z^3}{H^3} - 1 = 0 \qquad 10.3$$

$$\frac{1}{R_1^2}(x-x_c)^2 + \frac{1}{R_2^2}(y-y_c)^2 + \frac{1}{H^n}z^n - 1 = 0 \qquad 10.4$$

$$n \geq 1$$

Figure 4A:
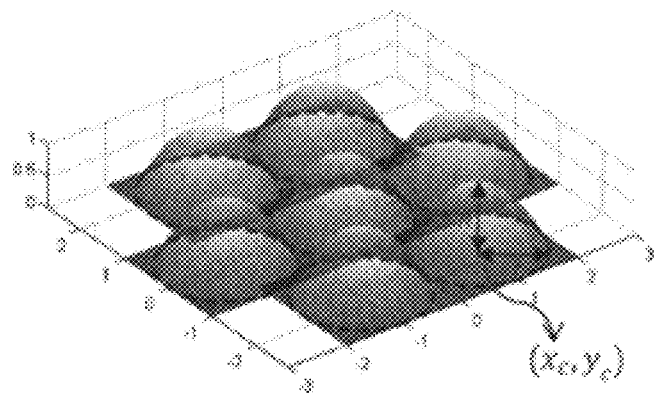
FIGS. 4(a), (b), and (c) show an example microlens array.
Figure 4B:
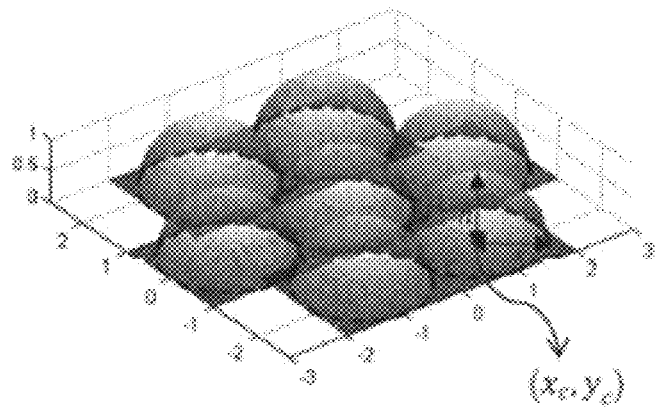
Figure 4C:
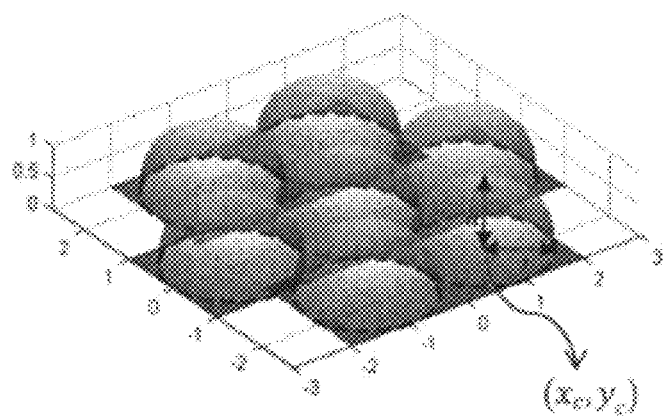

FIGS. 4(a), (b), and (c) show a microlens array with (a) parabolic surfaces, equation 10.1, (b) spherical surfaces, equation 10.2, and (c) cubic surfaces, equation 10.3. The coordinate system is illustrated in FIGS. 4(a), (b), and (c). Each of the microlenses is centered around its own origin ($x_c, y_c$). According to an embodiment, the emissive (top) side of an OLED substrate is patterned with an array of microlenses as shown in FIGS. 4(a), (b), and (c). Coordinates x and y are in plane, and z is out of plane. Each microlens in the array has a symmetry axis running through a separate $x_c$ and $y_c$.

Figure 5A:
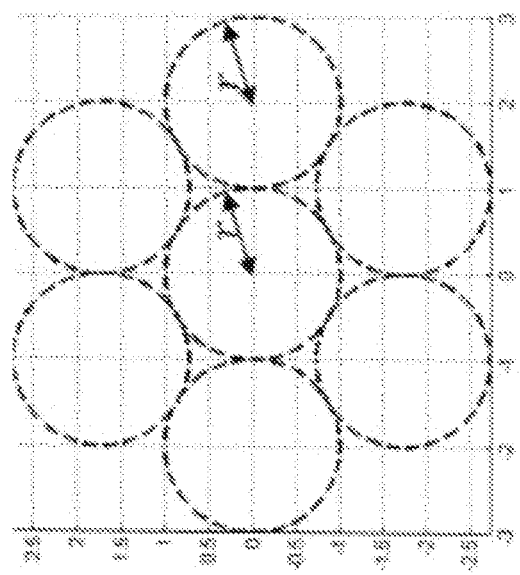
FIGS. 5(A) and (B) show an example hexagonal close packed array of microlenses and a radial cross section of a microlens.
Figure 5B:
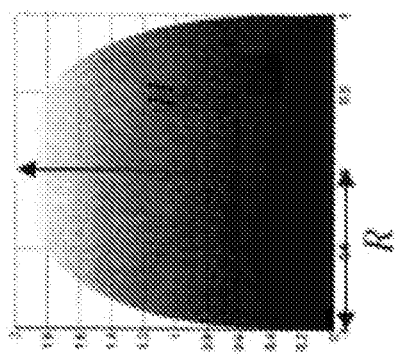

In an embodiment, the multiple microlenses are closely packed. In general, close-packing of microlenses is a dense arrangement of microlenses in a regular arrangement (or lattice), typically in a repeating pattern. Closely packed refers to the most tightly packed or space-efficient composition of microlens structures (lattices) that's allowed by manufacturing techniques. For example, for a hemisphere microlens system, the neighboring base circles are tangential to each other. In general, this will be limited by the manufacturing techniques being used. FIG. 5(a) shows a hexagonal close packed array of microlenses and FIG. 5(b) shows a radial cross section of a microlens. The arrangement of microlenses in FIG. 5(a) is an optimally packed array of single sized lenses. The microlens radius R and height H are shown in FIG. 5(b) and the thickness profile of this microlens obeys equation 10.3 shown above.

Figures 6A, 6B:
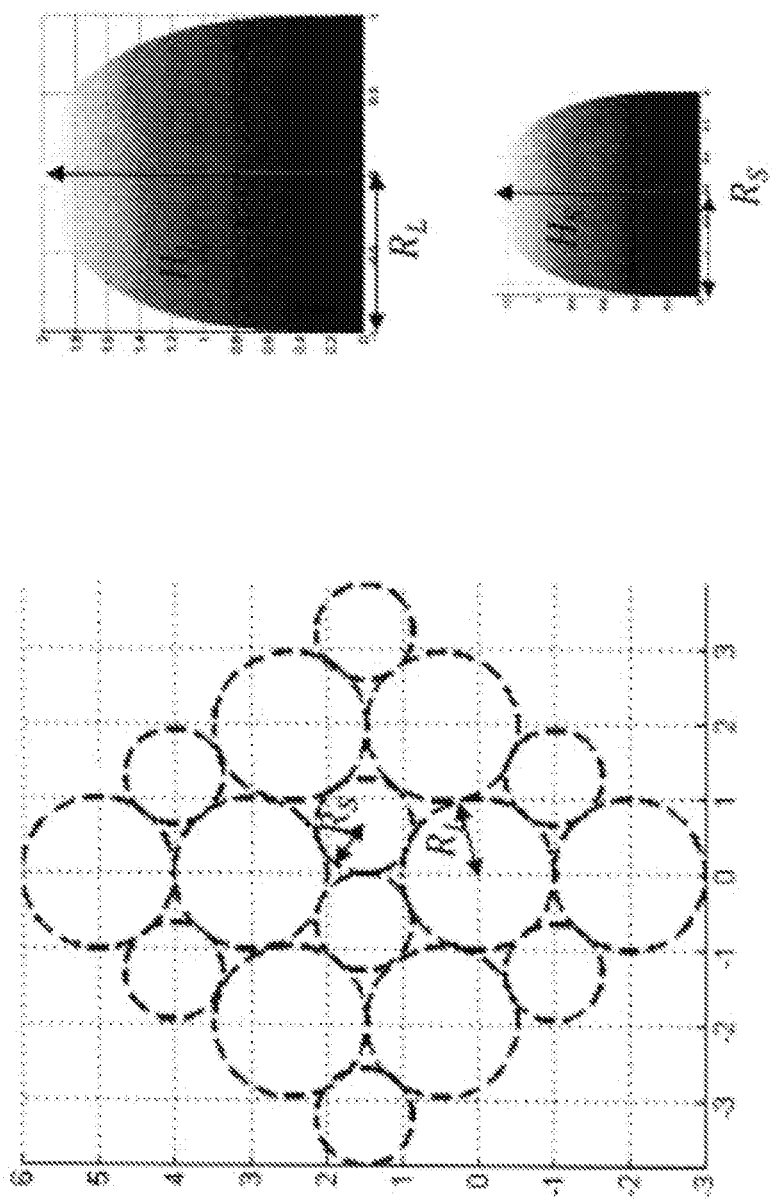
FIGS. 6(A) and (B) show an example microlens array of incorporating two different sizes of microlenses and a radial cross section of each size of microlens.

Using microlenses with more than 2 different sizes can further improve the fill factor of microlens, and thus improve light extraction. In particular, packing of microlenses can be improved by incorporating microlenses of multiple different sizes into the array as shown in FIGS. 6(A) and (B). This improved packing increases the fill factor of the microlens array, leading to an overall improvement in outcoupling. FIG. 6(A) shows an array incorporating two different sizes of microlenses for optimal area coverage and FIG. 6(B) shows a radial cross section of the two different sized microlenses. The large lens radius $R_L$ and height $H_L$, and the small lens radius $R_S$ and height $H_S$ are shown in FIG. 6(B). The thickness profile of the microlenses obey equation 10.3 above. As an example, the dimensions of the smaller microlenses are 0.6376× that of the larger lenses, although other varying dimensions of microlenses may be used. This improved packing increases the fill factor of the microlens array, leading to an overall improvement in outcoupling. According to an embodiment, at least one microlens of the multiple microlenses has a base measurement $R_1$ and at least one microlens of the multiple microlenses has a base measurement $R_2$, and $R_1$ is different from $R_2$. In the embodiment in which the base measurement R is a radius, at least one microlens of the multiple microlenses has a radius $R_1$ and at least one microlens of the multiple microlenses has a radius $R_2$, and $R_1$ is different from $R_2$. In one embodiment, the multiple microlenses are arranged in a geometrically repeating pattern, for example as shown in FIG. 6(A). In an embodiment, the device has a fill factor defined by the fraction of a surface of the light emitting device covered by the multiple microlenses, and the fill factor, i.e., the fraction of the surface of the device covered by microlenses, is greater than about 85%, and at least about 90%.

Figure 7:
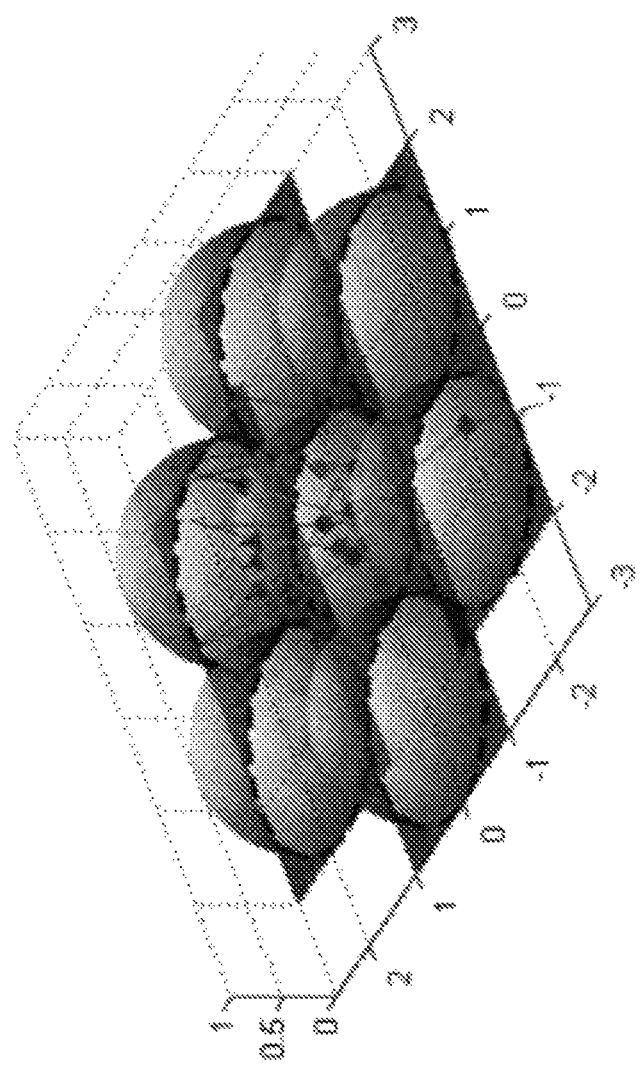
FIG. 7 shows an example of rays propagating from an array of microlenses.

FIG. 7 shows an example of rays propagating from an array of micro lenses. When a ray approaches the surface of a microlens, it can refract and pass from the substrate to air or it can reflect back into the substrate. These outcomes are governed by Fresnel's equations. Occasionally a ray that is outcoupled from one lens can intersect a neighboring lens and incouple back into the substrate. FIG. 7 shows points of interaction between rays and the substrate as marked with dots. According to the present disclosure, outcoupling can be further enhanced by using a high index substrate to avoid loss of light between the device and substrate. Microlenses help to mitigate the outcoupling loss at the substrate/air interface to allow for a net improvement iii outcoupling. In an embodiment, the multiple microlenses are comprised of a material having an index of refraction X, and a layer of the organic light emitting device adjacent to the outcoupling layer is comprised of a material having an index of refraction Y. In this case, the difference between X and Y is less than about 0.1.

In an embodiment, a layer of the organic light emitting device adjacent to the outcoupling layer is comprised of a material having an index of refraction of at least about 1.7. For example, referring back to FIG. 3A, the layer 301 may be comprised of a material having an index of refraction of at least 1.7 In an embodiment, the outcoupling layer is comprised of a single material. In some cases, the outcoupling layer is comprised of a transparent polymer substrate. In some cases, the transparent polymer substrate is flexible. In an embodiment, the multiple microlenses are comprised of a first material and a portion of the outcoupling adjacent to the organic light emitting device is comprised of a second material. In an aspect, the multiple microlenses may be comprised of a material having an index of refraction greater than about 1.5, greater than about 1.6, or greater than about 1.7.

According to an embodiment, microlens arrays can be fabricated by stamping, in which material is laid down onto a substrate in a pattern. Microlens arrays can be fabricated by embossing, in which material that is already present on the substrate is formed into a desired surface shape using a mold. An array of stamped aspherical microlenses will generally require a post-stamping step to form the deposited spots of micro lens polymer into the desired shape. Electrostatic stretching of an array of UV curable polymer microlenses, as demonstrated by Kuo et al. 2010 is an example of such an approach. Stamped polymers generally must be curable and there are relatively few such high index polymers on the market. UV curable polymers with refractive indices of n greater than 1.6 are available (Morford et al., Press-patterned UV-curable High Refractive Index Coatings, Society of Photo-Optical Instrumentation Engineers, pp 612301-612301-11 (2006)).

While the embossing process may seem to be conceptually simple, some care must be taken to generate a metal mold with the appropriate microstructure. Once a master with the appropriate microstructure has been generated, a metal mold can be fabricated by electroforming over the master using the lithography-electroforming-molding (LIGA) process (Becker et al., Fabrication of Microstructures with High Aspect Ratios and Great Structural Heights by Synchrotron Radiation Lithography, Galvanoforming, and Plastic Moulding (LIGA Process), Microelectronic Engineering 4 (1986) 35-56). An aspheric lens master can be fabricated using a process such as the polymer stamping and electrostatic stretching process described earlier. It should be noted that although a master must have the correct shape, its optical properties are irrelevant. The master can be stamped onto a conductive substrate to be compatible with the LIGA process. When immersed in a metal plating bath, metal accumulates on the master to form a mold. Regions occupied by polymer leave voids after the process is complete. The mold is then ready to use after appropriate finishing steps.

According to an embodiment, the multiple microlenses are embossed into the substrate, such as a polymer substrate.

Embossing often refers to another plastic technique which involves forming a layer of uncured polymer pre-coated onto a more robust polymer substrate. This facilitates the formation of a master. Since metal is not required, a mold can be cast directly from the master using curable polymer (Liu et al. 2010). Similarly a roller coated with a cured plastic mold can be used to emboss substrates after it has, itself been embossed using a master. It may be possible to adapt production of aspheric micro lenses from curable polymer to roll-to-roll processing using technology described in U.S. Pat. No. 8,257,793 B2 (Forrest 2010).

According to an embodiment of the disclosed subject matter, a method of fabricating an emissive device is provided. The method includes fabricating an outcoupling layer that includes multiple microlenses on a first surface of a substrate. For each microlens among the multiple microlenses, each point on a surface of the microlens has a tangent plane that forms an interior angle of not more than 90 degrees with an interface of the outcoupling layer and the substrate. Additionally, each microlens among the multiple microlenses has a lens height H and a largest base measurement 2R, where H/R is greater than 1. The method may further include obtaining an organic light emitting device, and disposing the organic light emitting device on a second surface of the substrate opposite the first surface. For example, the method of fabricating an emissive device may include fabricating an outcoupling layer that includes multiple microlenses on a first surface of a substrate prior to depositing an OLED on a second surface of the substrate, where the second surface is opposite the first surface. In one embodiment, the multiple microlenses are embossed into the substrate. According to an embodiment, the multiple microlenses may be formed by a subtractive process or by an additive process.

The organic light emitting device described herein may include an anode, a cathode, and an organic emissive layer disposed between the anode and the cathode. The organic emissive layer may include a host and a phosphorescent dopant.

EXPERIMENTAL

Figure 8B:
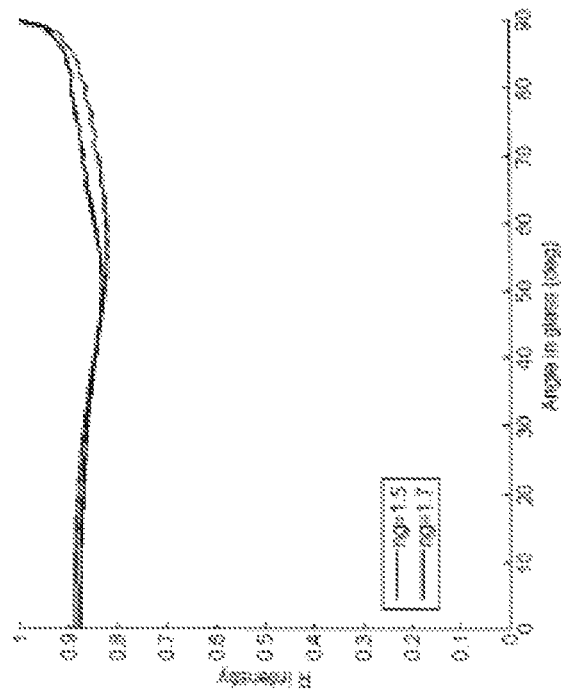
FIGS. 8(A) and (B) show use of Berrman's method to handle reflections from the microlens array to air interface onto the OLED structure.
Figure 8A:
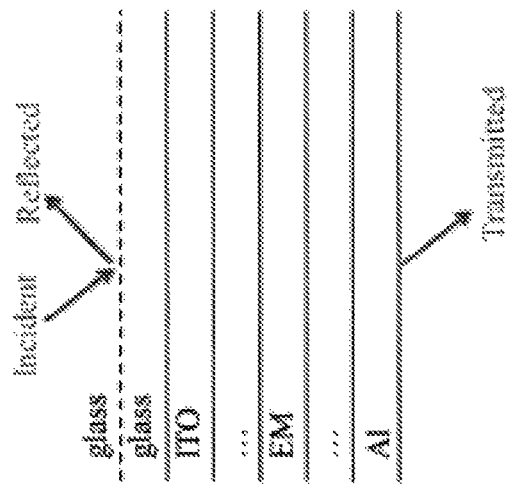

FIGS. 8(A) and (B) shows how Berreman's method is used to model reflections from the microlens array to air interface onto the OLED structure. FIG. 8A shows a stack of thin films constituting the OLED grown onto the reverse of a glass substrate. This film includes an indium tin oxide (ITO) anode, the emissive layer of the OLED (EM) and the aluminum (Al) cathode. FIG. 8(A) also shows incident, reflected, and transmitted light rays. FIG. 8(B) shows the fraction of light reflected from the layered structure of FIG. 8(A) as a function of incident angle. Light that is not reflected is generally lost due to absorption at the aluminum cathode. Light that is reflected by the OLED structure has a second opportunity to be outcoupled to air through the microlens array. Therefore a highly reflective OLED structure improves outcoupling efficiency.

Figure 9A:
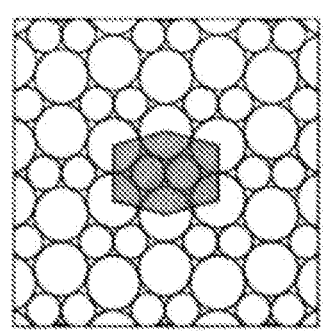
FIGS. 9(A) and (B) show an example of the domain over which the ray tracing model simulates outcoupling from microlens structures.
Figure 9B:
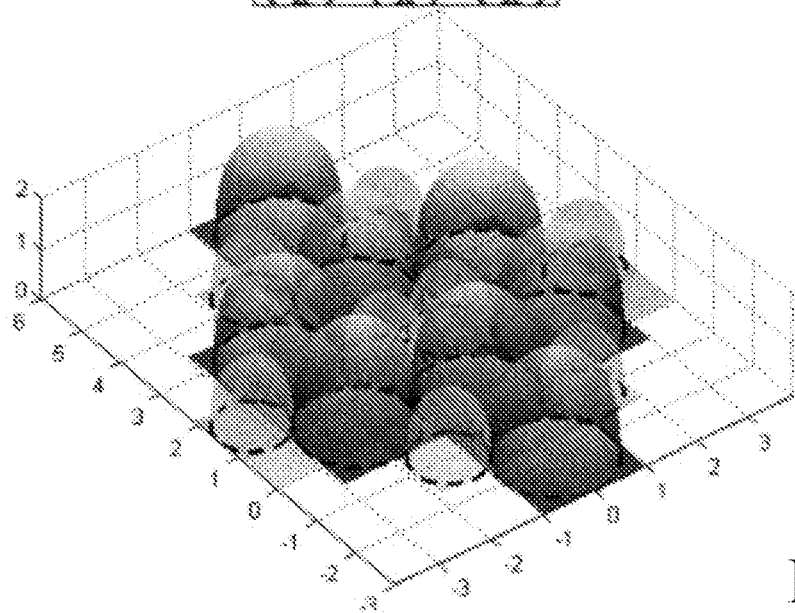

A multiple length-scale model was used to estimate the amount of light various microlens architectures could outcouple to air. Berreman's method was first used to handle thin film optical effects in the OLED structure and determine the angular distribution of light entering the substrate. Both forward and backward propagating light from the emissive layer was considered when solving for the distribution of light into the substrate. Light generated by the OLED was assumed to have random polarization. The results of Berreman's method were used to generate an angular distribution of rays propagating through the substrate using a Monte-Carlo ray tracing algorithm. Rays were introduced at random points beneath a repeating unit of the specific micro lens array architectures under study. An example of such a repeating unit, that forms the domain of the ray trace simulation, is shown in FIGS. 9(A) and (B). FIGS. 9(A) and (B) show an example of the domain over which the ray tracing model simulates outcoupling from microlens structures. FIG. 9(A) shows a view normal to the plane of the substrate. The microlens pattern is broken into periodic repeating cells such as the shaded region and a single cell is chosen as the domain of the simulation. FIG. 9(B) shows the topography of the microlenses in such a cell. In this case, the cell contains a pattern of two differently sized micro lenses. Interactions between rays of light and the curved surfaces of the microlens array were governed by the Fresnel equations. Transmission and reflection coefficients were calculated as an average of $\sigma$ and $\pi$ polarization cases, which depend only on the angle of incident light ray with respect to the normal of plane tangent to the surface where a ray intersects. Light rays in model were allowed to reflect between lens surfaces up to 30 times before leaving the simulation. Rays that reflect once off of the OLED structure after failing to outcouple to air on their first pass through the substrate are also considered. An example of rays tracing through a simulated microlens array is shown in FIG. 7. Simulation results are expressed by integrating the strength of light emitted into the air by the substrate, including both the curved microlenses and flat areas between them, and comparing that value to the light introduced at the emissive layer.

Berreman's method was also used to compute the direction and strength of reflection off of the OLED layers for rays of light that do not leave the substrate on its first pass due to reflection off of the microlenses. The structure had a reflectivity of between 0.8 and 0.9 depending incident angle. The modeled structure and the reflectivity of the OLED structure as a function of incident angle are given in FIGS. 8(A) and (B). Light that is not reflected is generally lost due to absorption at the aluminum cathode. Light that is reflected by the OLED structure has a second opportunity to be outcoupled to air through the micro lens array. Therefore a highly reflective OLED structure improves outcoupling efficiency.

Figure 10A:
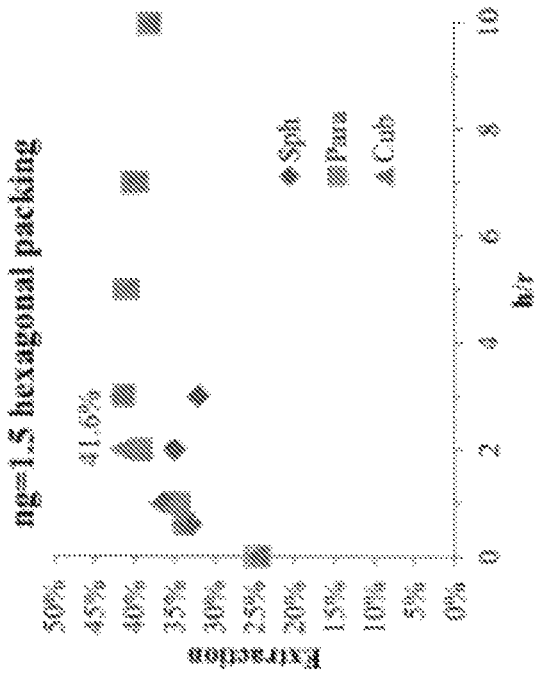
FIGS. 10(A) and (B) show the integrated light extraction of hexagonal close packed microlens arrays.
Figure 10B:
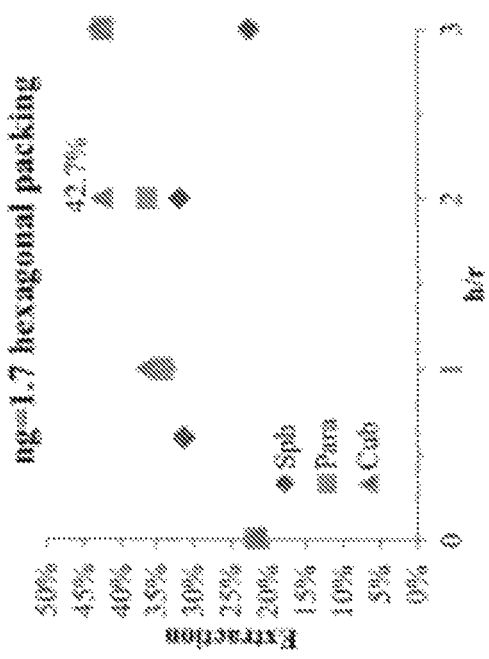

Ray tracing simulations demonstrate that significantly more efficient outcoupling can be obtained for parabolic and cubic microlenses than spherical microlenses. Spherical microlenses exhibit optimal outcoupling when H/R=1. For H/R<1 outcoupling from parabolic or cubic microlenses arrays is inferior to spherical microlenses. However, for H/R>1, improved outcoupling can be obtained for parabolic and cubic arrays than that obtained for spherical arrays at H/R=1 as shown in FIGS. 10(A) and (B). FIG. 10 shows the integrated light extraction of hexagonal close packed micro lens arrays. Light extraction in FIG. 10(A) is presented as a percentage of light generated in the OLED emissive layer that is outcoupled to air. FIG. 10(A) shows light extraction from a substrate and microlens array with n=1.5. Light extraction in FIG. 10(B) is normalized to the case of an OLED on a planar substrate of index of refraction n=1.5. FIG. 10(B) shows light extraction for the n=1.7 case. Light extraction is plotted as a function of H/R for lens profiles matching equations 10.1 (square), 10.2 (diamond) and 10.3 (triangle), as described above. The case of spherical lenses with H/R>1 was modeled using an array of hemispheres on cylindrical pedestals. Ratios of H/R of up to 10 were tested for various curvatures. Optimal outcoupling for parabolic and cubic arrays is achieved at H/R=2. A 166% enhancement over a plain glass array was achieved for a hexagonal pack of cubic micro lenses with index n=1.5 at H/R=2.

Figure 11B:
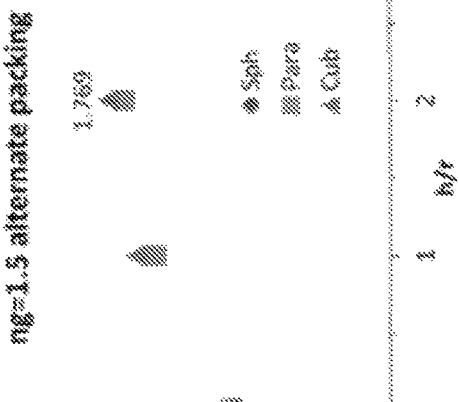
FIGS. 11(A), (B), (C), and (D) show the integrated light extraction of an optimally packed microlens array comprised of two differently sized microlenses.
Figure 11D:
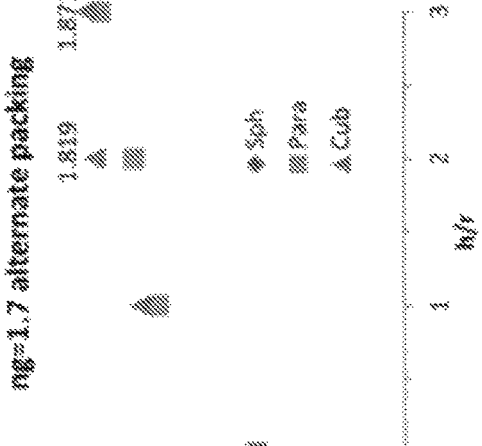
Figure 11A:
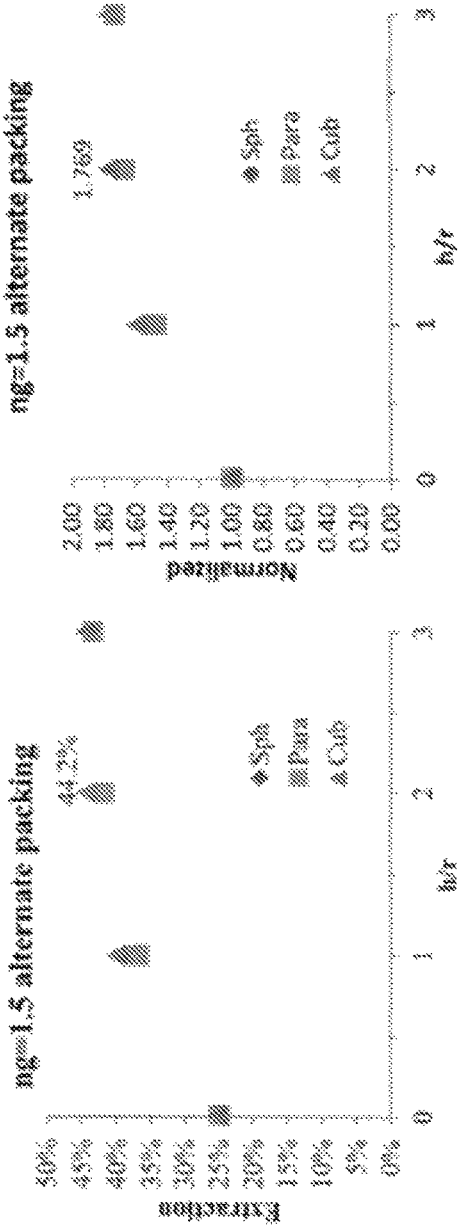
Figure 11C:
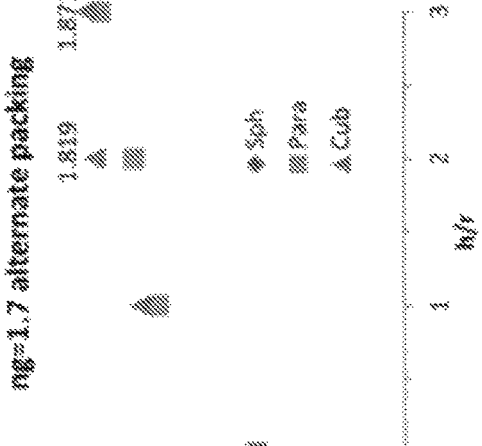

Packing of micro lenses can be improved by incorporating lenses of two different sizes into the array as shown in FIGS. 6(A) and (B). The dimensions of the smaller microlenses are 0.6376× that of the larger microlenses. This improved packing increases the fill factor of the microlens array, leading to an overall improvement in outcoupling. FIGS. 11(A), (B), (C), and (D) shows the integrated light extraction of an optimally packed micro lens array comprised of two differently sized lenses. FIGS. 11(A) and 11(C) show light extraction presented as a percentage of light generated in the OLED emissive layer that is outcoupled to air, where FIG. 11(A) shows n=1.5 and FIG. 11(C) shows n=1.7. FIGS. 11(B) and (D) show light extraction normalized to the case of an OLED on a planar substrate. FIG. 11(B) shows light extraction from a substrate and microlens array with n=1.5 and FIG. 11(D) shows light extraction for with n=1.7. Light extraction was plotted as a function of H/R for lens profiles matching equations 10.1 (square), 10.2 (diamond) and 10.3 (triangle), as discussed above. As shown in FIGS. 11(A), (B), (C), and (D), a 177% enhancement over a plain glass array is achieved for cubic two size array microlenses with index n=1.5 at H/R=2. Using microlenses with more than 2 different sizes can further improve the fill factor of microlens, and thus improve light extraction.

Outcoupling can be further enhanced by using a high index substrate to avoid loss of light between the device and substrate. Simulation indicates that an outcoupling of 171% can be achieved by cubic lenses with H/R=2 for a substrate with index n=1.7 compared with a planar substrate of n=1.5. Microlenses help to mitigate the outcoupling loss at the substrate/air interface to allow for a net improvement in outcoupling. If the novel, two lens size packing structure is applied, an outcoupling improvement of 187% can be achieved by cubic lenses of H/R=3 for a substrate with an index of n=1.7.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
an organic light emitting device comprising an organic emissive layer; and
an outcoupling layer optically coupled to the emissive layer and disposed on a surface of the organic light emitting device, the outcoupling layer comprising a plurality of microlenses arranged in a geometrically repeating pattern;
wherein the plurality of microlenses comprises:
a first type of microlens having a radius of about R1;
a second type of microlens having a radius of about R2, wherein R2 is different than R1;
wherein a fraction of the surface of the organic light emitting device covered by the plurality of microlenses is greater than about 85%.

2. The device of claim 1, wherein the fraction of the surface of the organic light emitting device covered by the plurality of microlenses is at least about 90%.

3. The device of claim 1, wherein each of the plurality of microlenses is a cubic microlens.

4. The device of claim 1, wherein R2 is about twice R1.

5. The device of claim 1, wherein the plurality of microlenses are embossed into the outcoupling layer.

6. The device of claim 1, wherein the outcoupling layer consists essentially of a single material.

7. The device of claim 1, wherein a layer of the organic light emitting device immediately adjacent to the outcoupling layer comprises a material having an index of refraction of at least 1.7.

8. The device of claim 7, wherein the layer immediately adjacent to the outcoupling layer consists essentially of the material having the index of refraction of at least 1.7.

9. The device of claim 1, wherein the plurality of microlenses comprises a material having an index of refraction of at least 1.5.

10. The device of claim 9, wherein the plurality of microlenses comprises a material having an index of refraction of at least 1.6.

11. The device of claim 10, wherein the plurality of microlenses comprises a material having an index of refraction of at least 1.7.

12. The device of claim 1, wherein at least one of the types of microlenses has a rectangular base.

13. The device of claim 1, wherein at least one of the types of microlenses has an elliptical base.

14. The device of claim 1, wherein each microlens of the plurality of microlenses has a thickness profile defined by a continuous function in r, wherein r is the distance from an axis of the microlens centered on the base of the microlens and normal to the interface of the outcoupling layer with the organic light emitting device, and wherein r is less than or equal to a radius of the microlens.

15. The device of claim 1, wherein the outcoupling layer comprises a single material.

16. The device of claim 1, wherein the plurality of microlenses comprise a first material and a portion of the outcoupling layer adjacent to the organic light emitting device comprises a second material different than the first material.

* * * * *